United States Patent
Ellsworth et al.

(10) Patent No.: US 8,810,448 B1
(45) Date of Patent: Aug. 19, 2014

(54) MODULAR ARCHITECTURE FOR SCALABLE PHASED ARRAY RADARS

(75) Inventors: Joseph R. Ellsworth, Worcester, MA (US); Michael P. Martinez, Worcester, MA (US); Craig H. McCordic, Medfield, MA (US); Jeffrey Paquette, Wakefield, MA (US); Scott R. Cheyne, Brookline, NH (US)

(73) Assignee: Raytheon Company, Waltham, MA (US)

( * ) Notice: Subject to any disclaimer, the term of this patent is extended or adjusted under 35 U.S.C. 154(b) by 18 days.

(21) Appl. No.: 13/230,271

(22) Filed: Sep. 12, 2011

Related U.S. Application Data

(63) Continuation of application No. 12/948,858, filed on Nov. 18, 2010, now abandoned.

(51) Int. Cl.
*G01S 7/03* (2006.01)

(52) U.S. Cl.
USPC .................. 342/175; 211/41.17; 361/699

(58) Field of Classification Search
USPC ........................................................ 342/175
See application file for complete search history.

(56) References Cited

U.S. PATENT DOCUMENTS

| | | | |
|---|---|---|---|
| 3,091,743 A | 5/1963 | Wilkinson |
| 3,665,480 A | 5/1972 | Fassett |
| 4,489,363 A | 12/1984 | Goldberg |
| 4,527,165 A | 7/1985 | deRonde |
| 4,698,663 A | 10/1987 | Sugimoto et al. |
| 4,706,094 A | 11/1987 | Kubick |
| 4,751,513 A | 6/1988 | Daryoush et al. |
| 4,835,658 A | 5/1989 | Bonnefoy |
| 5,005,019 A | 4/1991 | Zaghloul et al. |
| 5,055,852 A | 10/1991 | Dusseux et al. |
| 5,099,254 A | 3/1992 | Tsukii et al. |
| 5,276,455 A | 1/1994 | Fitzsimmons et al. |

(Continued)

FOREIGN PATENT DOCUMENTS

| | | |
|---|---|---|
| EP | 0 481 417 A | 4/1992 |
| EP | 1 764 863 A1 | 3/2007 |

(Continued)

OTHER PUBLICATIONS

Pluymers, B.A.; Reese, R.M., "Thermal Management of Active Electronically Scanned Array Transmit/Receive LRU (Line Replaceable Unit)," 2007 IEEE Radar Conference. pp. 150-155, Apr. 17-20, 2007.*

(Continued)

*Primary Examiner* — Matthew M Barker
(74) *Attorney, Agent, or Firm* — Daly, Crowley, Mofford & Durkee, LLP

(57) ABSTRACT

In one aspect, a radar array assembly includes two or more vertical stiffeners each having bores with threads and a first radar module. The first radar module includes radar transmit and receive (T/R) modules and a chassis having channels configured to receive a coolant. The chassis includes shelves having ribs. The ribs have channels configured to receive the coolant and the ribs form slots to receive circuit cards disposed in parallel. The circuit cards include the T/R modules. The chassis also includes set screws attached to opposing sides of the chassis. The set screws have bores to accept fasteners to engage the threads on a corresponding one of the two or more vertical stiffeners. The first radar module is configured to operate as a stand-alone radar array.

14 Claims, 16 Drawing Sheets

(56) References Cited

U.S. PATENT DOCUMENTS

| | | | |
|---|---|---|---|
| 5,327,152 A * | 7/1994 | Kruger et al. | 343/853 |
| 5,398,010 A | 3/1995 | Klebe | |
| 5,400,040 A | 3/1995 | Lane et al. | |
| 5,404,148 A | 4/1995 | Zwarts | |
| 5,431,582 A * | 7/1995 | Carvalho et al. | 439/372 |
| 5,451,969 A | 9/1995 | Toth et al. | |
| 5,459,474 A | 10/1995 | Mattioli et al. | |
| 5,488,380 A | 1/1996 | Harvey et al. | |
| 5,493,305 A | 2/1996 | Wooldridge et al. | |
| 5,563,613 A | 10/1996 | Schroeder et al. | |
| 5,592,363 A | 1/1997 | Atarashi et al. | |
| 5,646,826 A | 7/1997 | Katchmar | |
| 5,675,345 A | 10/1997 | Pozgay et al. | |
| 5,724,048 A | 3/1998 | Remondiere | |
| 5,786,792 A | 7/1998 | Bellus et al. | |
| 5,796,582 A | 8/1998 | Katchmar | |
| 5,854,607 A | 12/1998 | Kinghorn | |
| 5,907,304 A | 5/1999 | Wilson et al. | |
| 6,011,507 A | 1/2000 | Curran et al. | |
| 6,037,903 A | 3/2000 | Lange et al. | |
| 6,061,027 A | 5/2000 | Legay et al. | |
| 6,078,289 A | 6/2000 | Manoogian et al. | |
| 6,087,988 A | 7/2000 | Pozgay | |
| 6,091,373 A | 7/2000 | Raguenet | |
| 6,104,343 A | 8/2000 | Brookner et al. | |
| 6,127,985 A | 10/2000 | Guler | |
| 6,166,705 A | 12/2000 | Mast et al. | |
| 6,181,280 B1 | 1/2001 | Kadambi et al. | |
| 6,184,832 B1 | 2/2001 | Geyh et al. | |
| 6,208,316 B1 | 3/2001 | Cahill | |
| 6,211,824 B1 | 4/2001 | Holden et al. | |
| 6,218,214 B1 | 4/2001 | Panchou et al. | |
| 6,222,493 B1 | 4/2001 | Caille et al. | |
| 6,225,695 B1 | 5/2001 | Chia et al. | |
| 6,297,775 B1 | 10/2001 | Haws et al. | |
| 6,388,620 B1 | 5/2002 | Bhattacharyya | |
| 6,392,890 B1 | 5/2002 | Katchmar | |
| 6,424,313 B1 | 7/2002 | Navarro et al. | |
| 6,469,671 B1 * | 10/2002 | Pluymers et al. | 343/702 |
| 6,480,167 B2 | 11/2002 | Matthews | |
| 6,483,705 B2 | 11/2002 | Snyder et al. | |
| 6,611,180 B1 | 8/2003 | Puzella et al. | |
| 6,621,470 B1 | 9/2003 | Boeringer et al. | |
| 6,624,787 B2 | 9/2003 | Puzella et al. | |
| 6,661,376 B2 | 12/2003 | Maceo et al. | |
| 6,670,930 B2 | 12/2003 | Navarro | |
| 6,686,885 B1 | 2/2004 | Barkdoll et al. | |
| 6,703,976 B2 | 3/2004 | Jacomb-Hood et al. | |
| 6,731,189 B2 | 5/2004 | Puzella et al. | |
| 6,756,684 B2 | 6/2004 | Huang | |
| 6,856,210 B2 | 2/2005 | Zhu et al. | |
| 6,900,765 B2 | 5/2005 | Navarro et al. | |
| 6,943,330 B2 | 9/2005 | Ring | |
| 6,961,248 B2 | 11/2005 | Vincent et al. | |
| 6,995,322 B2 | 2/2006 | Chan et al. | |
| 7,030,712 B2 | 4/2006 | Brunette et al. | |
| 7,061,446 B1 | 6/2006 | Short, Jr. et al. | |
| 7,129,908 B2 | 10/2006 | Edward et al. | |
| 7,132,990 B2 | 11/2006 | Stenger et al. | |
| 7,180,745 B2 | 2/2007 | Mandel et al. | |
| 7,187,342 B2 | 3/2007 | Heisen et al. | |
| 7,272,880 B1 * | 9/2007 | Pluymers et al. | 29/428 |
| 7,417,598 B2 | 8/2008 | Navarro et al. | |
| 7,443,354 B2 | 10/2008 | Navarro et al. | |
| 7,444,737 B2 | 11/2008 | Worl | |
| 7,489,283 B2 | 2/2009 | Ingram et al. | |
| 7,508,338 B2 | 3/2009 | Pluymers et al. | |
| 7,508,670 B1 * | 3/2009 | Thorson et al. | 361/699 |
| 7,548,424 B2 * | 6/2009 | Altman et al. | 361/699 |
| 7,597,534 B2 | 10/2009 | Hopkins | |
| 7,717,470 B1 * | 5/2010 | Pluymers | 285/14 |
| 7,836,549 B1 * | 11/2010 | McGuigan | 16/266 |
| 2005/0110681 A1 | 5/2005 | Londre | |
| 2005/0151215 A1 | 7/2005 | Hauhe et al. | |
| 2006/0268518 A1 | 11/2006 | Edward et al. | |
| 2007/0152882 A1 | 7/2007 | Hash et al. | |
| 2008/0074324 A1 | 3/2008 | Puzella et al. | |
| 2008/0106467 A1 | 5/2008 | Navarro et al. | |
| 2008/0106482 A1 | 5/2008 | Cherrette et al. | |
| 2008/0150832 A1 | 6/2008 | Ingram et al. | |
| 2008/0316139 A1 | 12/2008 | Blaser et al. | |
| 2010/0039770 A1 * | 2/2010 | Danello et al. | 361/691 |
| 2010/0245179 A1 | 9/2010 | Puzella et al. | |
| 2011/0114289 A1 * | 5/2011 | Altman et al. | 165/80.4 |
| 2012/0051869 A1 * | 3/2012 | Johansen | 411/337 |

FOREIGN PATENT DOCUMENTS

| | | |
|---|---|---|
| EP | 1 436 859 B1 | 8/2007 |
| EP | 1 978 597 A1 | 10/2008 |
| JP | 61 224504 A | 10/1986 |
| JP | 4-122107 A | 4/1992 |
| JP | 06-097710 | 4/1994 |
| JP | 7-212125 | 8/1995 |
| JP | 2000-138525 A | 5/2000 |
| JP | 2005 505963 | 2/2005 |
| KR | 1020010079872 A | 8/2001 |
| WO | WO 98/26642 | 6/1998 |
| WO | WO 99/66594 | 12/1999 |
| WO | WO 01/06821 A1 | 1/2001 |
| WO | WO 01/20720 A1 | 3/2001 |
| WO | WO 01/33927 A1 | 5/2001 |
| WO | WO 01/41257 A1 | 6/2001 |
| WO | WO 03/003031 A1 | 4/2003 |
| WO | WO 2007/136941 A2 | 11/2007 |
| WO | WO 2007/136941 A3 | 11/2007 |
| WO | WO 2008/010851 A2 | 1/2008 |
| WO | WO 2008/010851 A3 | 1/2008 |
| WO | WO 2008/036469 A1 | 3/2008 |
| WO | WO 2010/111038 | 9/2010 |
| WO | WO 2011/046707 | 4/2011 |

OTHER PUBLICATIONS

Notification of International Search Report and Written Opinion of the International Searching Authority for PCT/US2010/049261, dated Feb. 7, 2011, 11 pages.
Response to Office Action of Dec. 1, 2010 from U.S. Appl. No. 12/694,450 dated Jan. 25, 2011, 11 pages.
Final Office Action dated Mar. 23, 2011 from U.S. Appl. No. 12/694,450 dated Jan. 25, 2011, 7 pages.
Div. Application (with translation of amended claims) as filed on Dec. 1, 2008 and assigned App. No. 10-2008-7029396.
Decision of Rejection dated Jul. 30, 2008 from KR Pat. App. No. 10-2004-7003900.
Notice of Trial Decision dated Mar. 23, 2010 from KR Pat. App. No. 10-2004-7003900.
EP Search Report for 06021905.2; dated Feb. 9, 2007; 8 pages.
European Office Action dated Nov. 3, 2005 from EP Pat. App. No. 02800372.1.
Response to European Office Action filed Jan. 12, 2007 from EP Pat. App. No. 02800372.1.
European Office Action dated Oct. 18, 2007 from EPO Pat. App. No. 06021905.2.
Response to European Office Action dated Oct. 18, 2007 filed in the EPO on Aug. 11, 2008 from EP Pat. App. No. 06021905.2.
Response to European Office Action dated Mar. 19, 2009 filed in the EPO on Nov. 19, 2009 from EP Pat. App. No. 06021905.2.
European Office Action dated Feb. 18, 2010 from EPO Pat. App. No. 06021905.2.
Notice of Allowance dated Feb. 2, 2007 from EP Pat. App. No. 02800372.1.
Korean Office Action dated Oct. 31, 2007 from KR Pat. App. No. 10-2004-7003900.
Response to Korean Office Action filed Mar. 26, 2008 from KR Pat. App. No. 10-2004-7003900.
Korean Office Action dated Feb. 25, 2009 from KR Pat. App. No. 10-2008-7029396.
Korean Office Action dated Nov. 27, 2009 from KR Pat. App. No. 10-2008-7029396.

(56) References Cited

OTHER PUBLICATIONS

Japanese Office Action dated Mar. 7, 2007 from JP Pat. App. No. 2003-533378.
Japanese Office Action dated Feb. 15, 2008 from JP Pat. App. No. 2003-533378.
Japanese Office Action dated Feb. 18, 2009 from JP Pat. App. No. 2003-533378.
Response to Japanese Office Action filed Jul. 5, 2007 from JP App. No. 2003-533378.
Response to Japanese Office Action filed Jun. 19, 2008 from App JP App. No. 2003-533378.
PCT Search Report of the ISA for PCT/US2010/026861 dated Jun. 18, 2010; 4 pages.
PCT Written Opinion of the ISA for PCT/US2010/026861 dated Jun. 18, 2010; 5 pages.
Office Action dated Jun. 11, 2010 from U.S. Appl. No. 12/694,450.
Response to Office Action of Jun. 11, 2010 from U.S. Appl. No. 12/694,450 dated Sep. 21, 2010.
Carter; "'Fuzz Button' interconnects and microwave and mm-wave frequencies;" IEEE Seminar, London, UK; Mar. 1-7, 2000; 7 pages.
Jerinic et al.; "X-Band "Tile" Array for Mobil Radar;" internal Raytheon Company publication; Spring 2003; 4 pages.
Puzella et al.; "Digital Subarray for Large Apertures;" slide presentation; internal Raytheon Company publication; Spring 2003; pp. 1-22.
Puzella et al.; "Radio Frequency Interconnect Circuits and Techniques;" U.S. Appl. No. 11/558,126, filed Nov. 9, 2006; 57 pages.
PCT International Preliminary Examination Report and Written Opinion of the ISA for PCT/US2002/30677 dated Nov. 27, 2003; 10 pages.
PCT International Preliminary Examination Report and Written Opinion of the ISA for PCT/US2007/074795 dated Apr. 2, 2009; 7pages.
PCT Search Report of the ISA for PCT/US2007/074795 dated Dec. 19, 2007; 5 pages.
PCT Written Opinion of the ISA for PCT/US2007/074795 dated Dec. 19, 2007; 5 pages.
Bash et al,; "Improving Heat Transfer From a Flip-Chip Package;" Technology Industry; Email Alert RSS Feed; Hewlett-Packard Journal, Aug. 1997; 3 pages.
Marsh et al.; "5.4 Watt GaAs MESFET MMIC for Phased Array Radar Systems;" 1997 Workshop on High Performance Electron Devices for Microwave and Optoelectronic Applications, Nov. 24-25, 1997; pp. 169-174.
U.S. Appl. No. 12/482,061, filed Jun. 10, 2009, file through Dec. 8, 2010, 196 pages.
Notice of Appeal and Pre-Appeal Brief Request for Review filed Aug. 30, 2011 from U.S. Appl. No. 12/694,450, 6 pages.
Response to European Office Action letter from FA dated Nov. 23, 2010, EP Pat. App. No. 06021905.2.

\* cited by examiner

MODULAR ARCHITECTURE FOR SCALABLE PHASED ARRAY RADARS

CROSS REFERENCE TO RELATED APPLICATION

This application is a continuation of and claims priority to U.S. application Ser. No. 12/948,858 filed Nov. 18, 2010 which is incorporated herein by reference in its entirety.

GOVERNMENT SPONSORED RESEARCH

This invention was made with Government support under Contract Number N00024-09-C-5313 awarded by the Department of the Navy. The United States Government has certain rights in the invention.

BACKGROUND

As is known in the art, a phased array antenna includes a plurality of active circuits spaced apart from each other by known distances. Each of the active circuits is coupled through a plurality of phase shifter circuits, amplifier circuits and/or other circuits to either or both of a transmitter and receiver. In some cases, the phase shifter, amplifier circuits and other circuits (e.g., mixer circuits) are provided in a so-called transmit/receive (T/R) module and are considered to be part of the transmitter and/or receiver.

The phase shifters, amplifier and other circuits (e.g., T/R modules) often require an external power supply (e.g., a DC power supply) to operate correctly. Thus, the circuits are referred to as "active circuits" or "active components." Accordingly, phased array antennas which include active circuits are often referred to as "active phased arrays."

Active circuits dissipate power in the form of heat. High amounts of heat can cause active circuits to be inoperable. Thus, active phased arrays must be cooled. In one example heat-sink(s) are attached to each active circuit to dissipate the heat.

SUMMARY

In one aspect, a radar array assembly includes two or more vertical stiffeners each having bores with threads and a first radar module. The first radar module includes radar transmit and receive (T/R) modules and a chassis having channels configured to receive a coolant. The chassis includes shelves having ribs. The ribs have channels configured to receive the coolant and the ribs form slots to receive circuit cards disposed in parallel. The circuit cards include the T/R modules. The chassis also includes set screws attached to opposing sides of the chassis. The set screws have bores to accept fasteners to engage the threads on a corresponding one of the two or more vertical stiffeners. The first radar module is configured to operate as a stand-alone radar array.

In another aspect, a radar module includes radar transmit and receive (T/R) modules and a chassis having channels configured to receive a coolant. The chassis includes shelves having ribs. The ribs have channels configured to receive the coolant. The ribs form slots to receive circuit cards disposed in parallel. The circuit cards include the T/R modules. The radar module is configured to perform as a standalone radar array and perform with other radar modules to form a radar array.

In a further aspect, a radar radiator panel, includes a radome, cyanate ester quartz (CEQ) coupled to the radome and a stacked assembly coupled to the CEQ, the stacked assembly comprising a thermal conductive layer configured to facilitate a transfer of heat to the radome.

One or more of the aspects above may include one or more of the following features. The radar array module may include a dual digital receiver exciter (DDREX) module, a synthesizer module and an auxiliary power module disposed in the slots. The radar array assembly may include an array plate having a first side and a second side opposite the first side, a radiator panel attached to the first side of the array plate and RF jumpers attached to the second side of the array plate. The array plate may be coupled to the vertical stiffeners. The first radar array module may include a digital receiver and exciter (DREX) backplane coupled to the chassis, an RF backplane coupled to the DREX backplane and an overlap beamformer having a first side and a second side opposite the first side. The first side of the overlap beamformer coupled to the RF backplane and the second side of the overlap beamformer coupled to the RF jumpers. The radiator panel may include stacked assemblies each comprising a thermal conductive layer. The thermal conductive layer may include at least one of aluminum and copper. The thermal conductive layer may be greater than 1 mil. The thermal conductive layer may be about 60 mils. The radar array assembly may include a second radar module configured to be substantially the same as the first radar module. A set screw may include a notch configured to be engaged by a flat tip screwdriver.

DESCRIPTION OF THE DRAWINGS

FIG. 3B is a side-view the radar module attached to the radar array frame structure.

FIG. 4B is a cross-sectional view of the set screw securing the chassis to a vertical stiffener.

DETAILED DESCRIPTION

Existing phased array architectures contain cooling systems, power systems and signal distribution systems that are sized to match the size of the array. Resizing the array requires a redesign of each of those systems. The cooling system is redesigned to control device operating temperatures and thermal gradients to avoid negatively impacting performance.

This system redesign is costly and takes a significant amount of time to implement. Also, even if the number of line replaceable units (LRUs) could be increased (e.g., to accommodate a larger array size), the number of LRUs will be limited by power and control limitations because each row of LRUs is cooled and powered in series.

As described herein, a radar module may be used as a building block to form various radar array sizes. Each radar module is fabricated to be identical. In particular, each radar module receives in parallel the necessary coolant, power and control signals necessary to be a stand-alone antenna array. Thus, by merely adding radar modules together, the radar array sizes are scalable. In one example, the radar modules can form multiple array sizes from two feet to thirty-two feet and beyond.

Figure 1A:
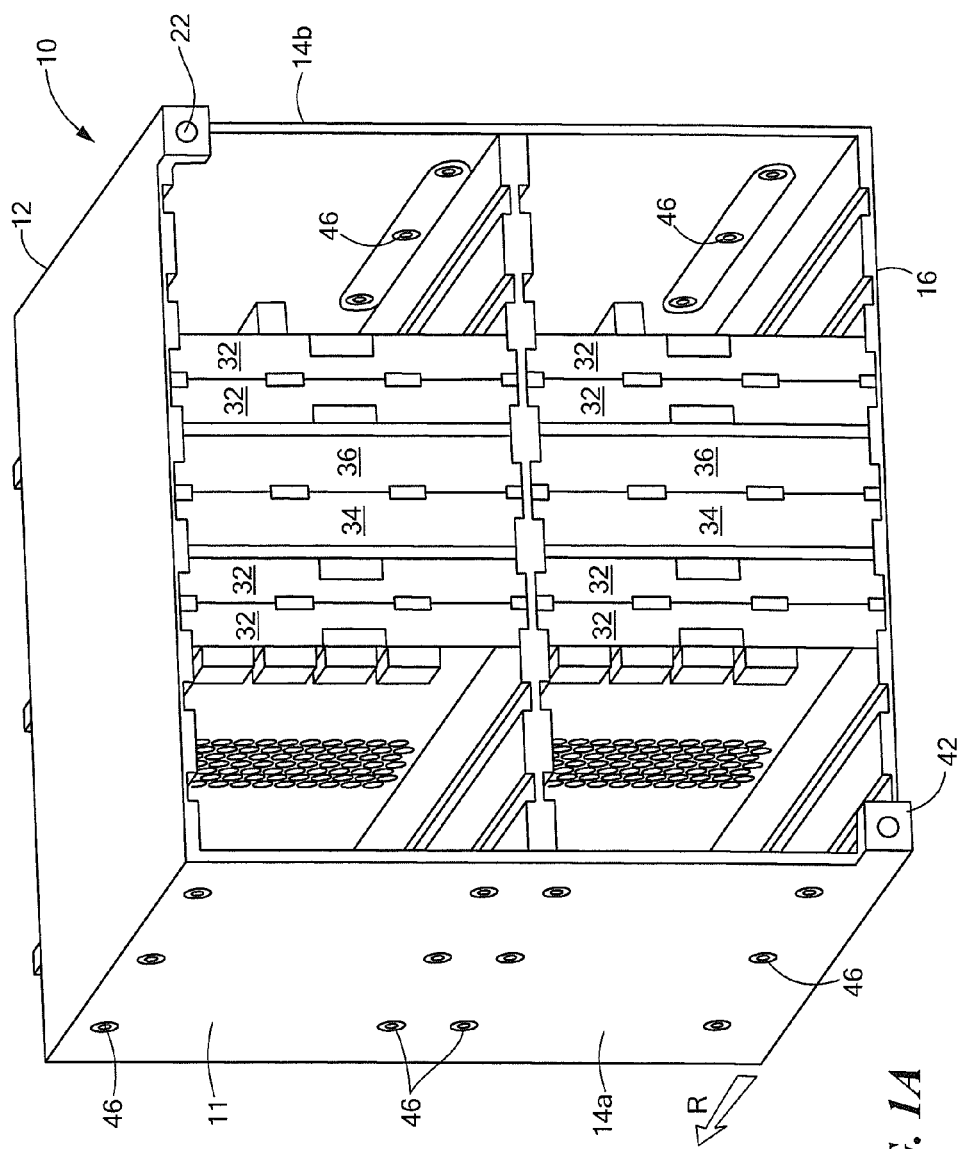
FIGS. 1A and 1B are plan views of a radar module.
Figure 1B:
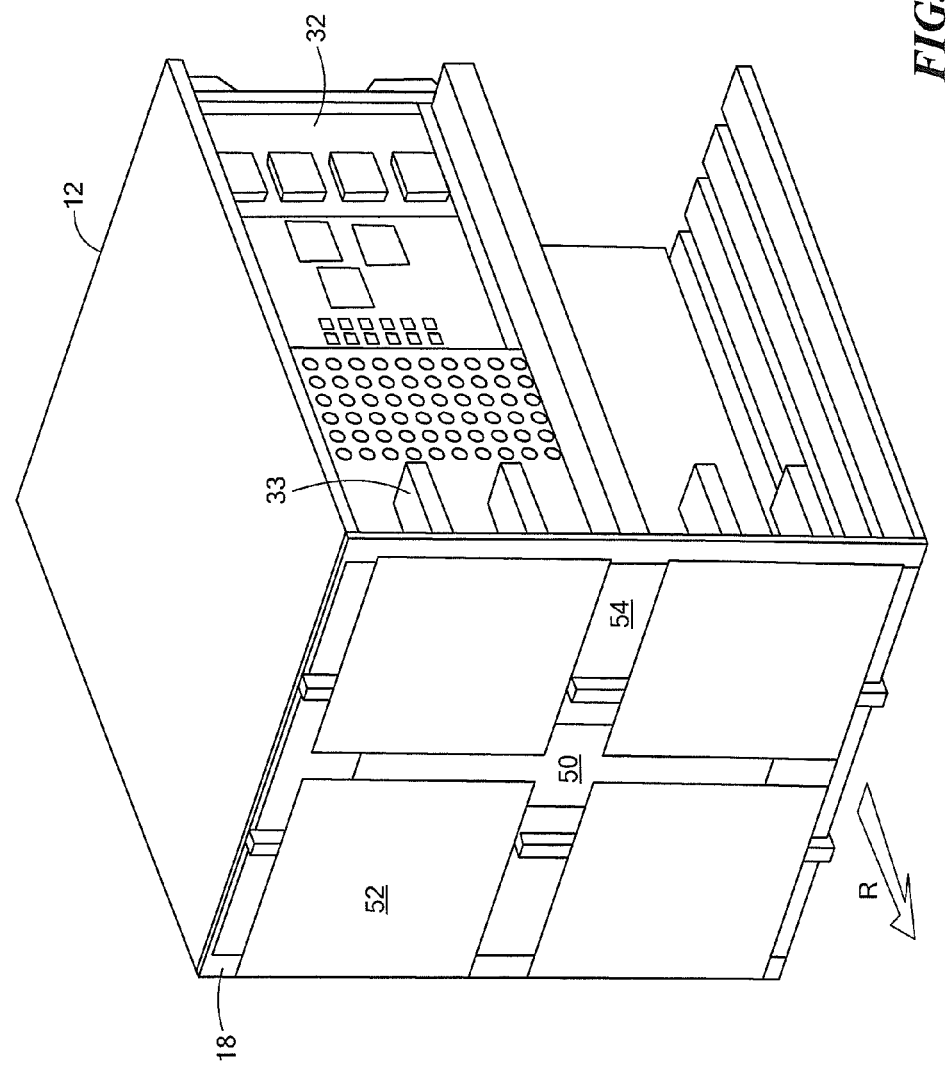

Referring to FIGS. 1A and 1B, a radar module 10 includes a chassis 11 that includes a top cold plate 12, a supply manifold 14a with an input port 42, a return manifold 14b with an output port 22, a bottom cold plate 16 and a front plate 18. The chassis 11 is configured to hold LRUs (e.g., circuit cards) such as transmit/receive integrated microwave modules (TRIMMs) 32 that include transmit/receive (T/R) modules (33), dual digital receiver exciter (DDREX) modules 34, a synthesizer module 36, and an auxiliary/controller module 40.

The chassis 11 performs a cooling function. For example, the T/R modules 33 produce high amounts of heat which must be dissipated or else the active circuits (e.g., power amplifiers) will cease to operate properly. The supply manifold 14a includes channels that receive coolant at the port 42. The coolant is circulated through out the chassis 11 and removed via the return manifold 14b out the port 22. In particular, the chassis 11 performs as a heat sink drawing the heat away from the active circuits (e.g., in the T/R modules 33). The chassis 11 includes set screws 46 attached to the supply manifold 14a and to the return manifold 14b.

In operation the radar module radiates energy in a direction R. In particular, the T/R modules 33 radiate energy in the R direction.

The radar module 10 also includes a digital receiver and exciter (DREX) backplane 54 attached to the front plate 18, an RF backplane 50 attached to the DREX backplane and overlap beamformers 52 attached to the RF backplane.

Figure 2A:
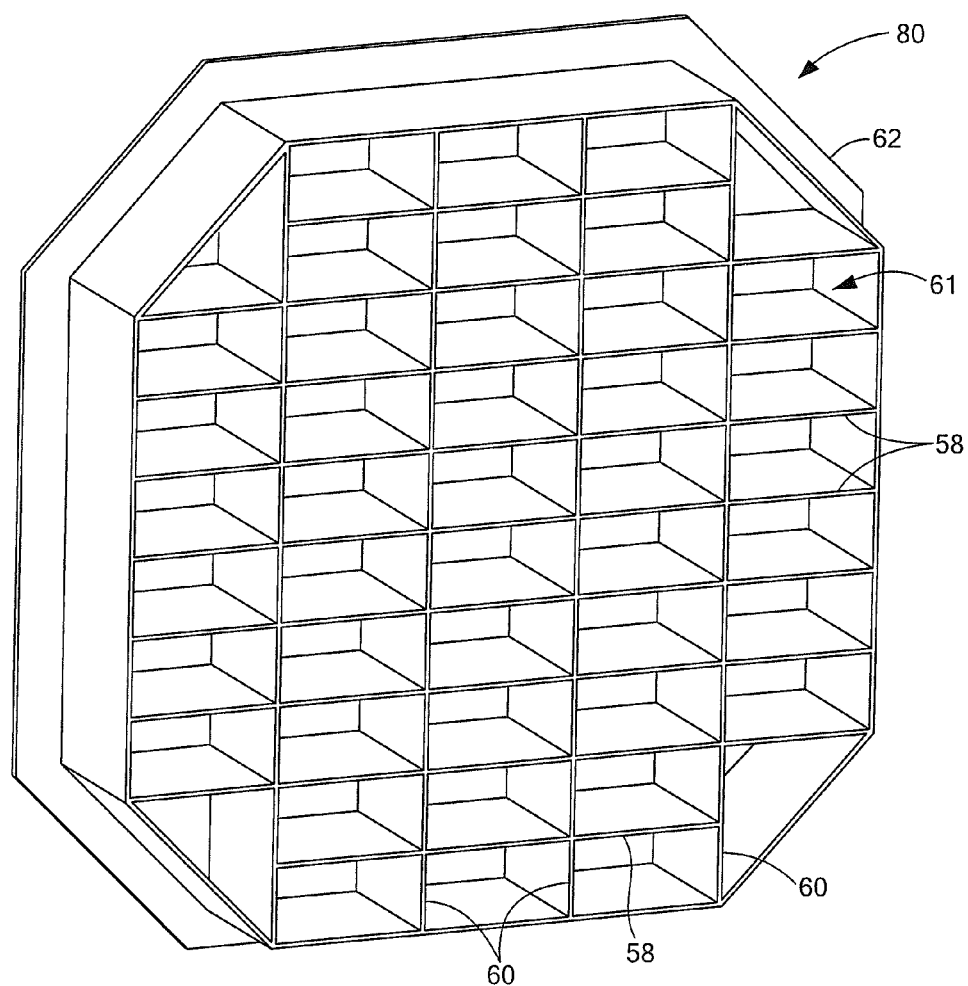
FIGS. 2A and 2B are plan views of different sized radar array frame structures.
Figure 2B:
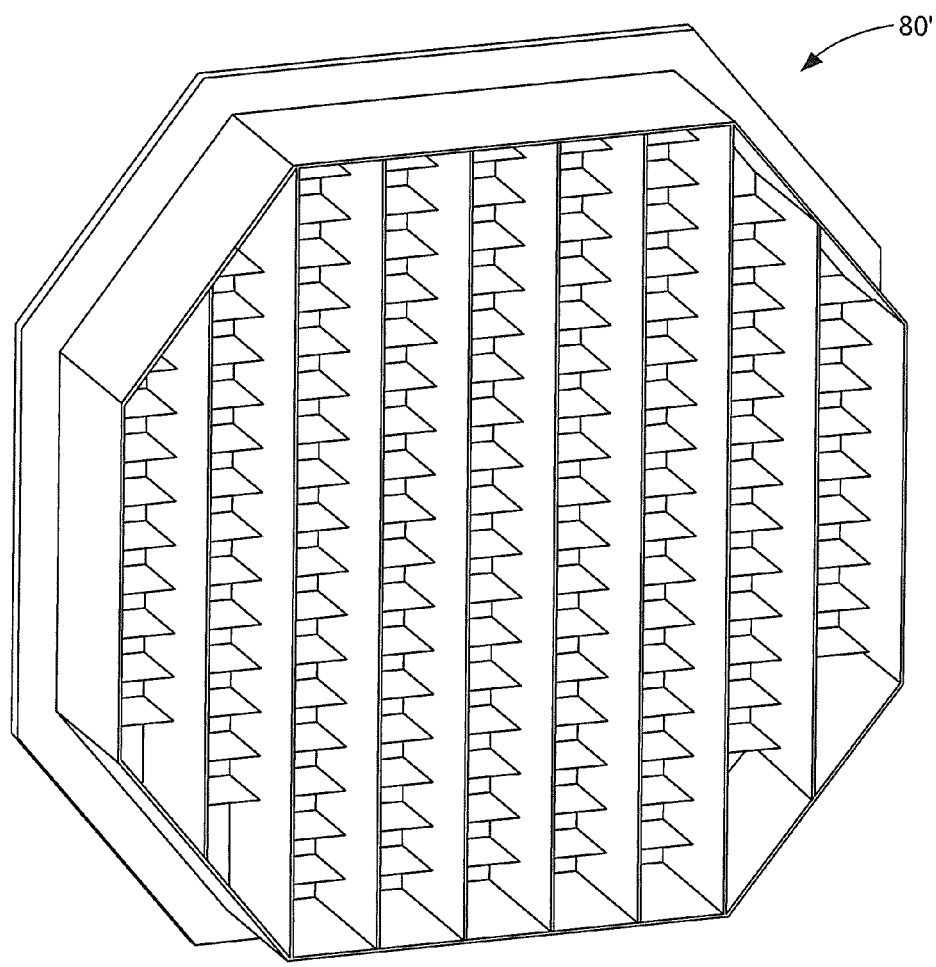

Referring to FIGS. 2A and 2B, radar modules 10 may be secured inside honey-combed structures called radar array frame structures. For example, a radar array frame structure 80 includes an array plate 62 with vertical stiffeners 60 and horizontal stiffeners 58 attached to the array plate. The vertical stiffeners 60 and the horizontal stiffeners 58 form cavities (e.g., a cavity 61) in which a single radar module 10 may be disposed inside. In one example, the radar module 10 rests on a horizontal stiffener 58 and is secured to the vertical stiffeners using set screws 46 attached to the supply manifold 14a and the return manifold 14b.

The radar array frame structure 80 in FIG. 2A can include thirty-six radar modules 10 with an active area of about eight square meters. A radar array frame structure 80' in FIG. 2B can hold one hundred and sixteen radar modules 10 with an active area of about thirty-seven square meters. In other examples, the horizontal stiffeners 58 are not used; but rather, each radar module 10 is secured to two vertical stiffeners 60.

Figure 3A:
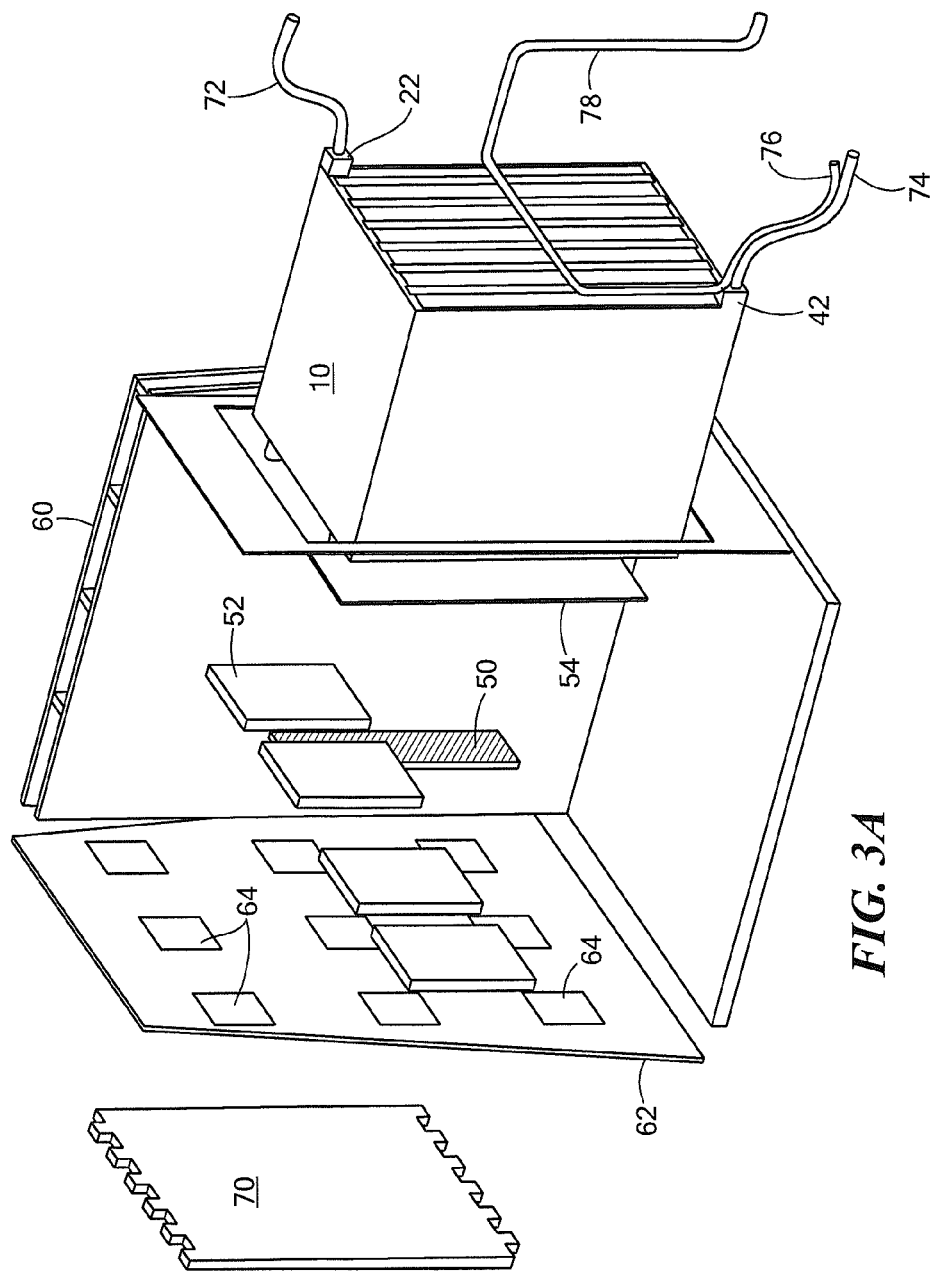
FIG. 3A is an exploded view of the radar module and a portion of a radar array frame structure.

Referring to FIGS. 3A and 3B, a radiator panel 70 is attached to one side of the array plate 62 and RF jumpers 64 are attached to the opposite side of the array plate. The RF jumpers 64 are attached to the overlap beamformers 52. In one example, each overlap beamformer is coupled to four RF jumpers 64.

As shown in FIG. 3A a coolant supply line 74 is coupled to the port 42 and a coolant return line 72 is coupled to the port 22. Data is supplied to the radar module 10 by a line 76 and power is supplied by a line 78.

Figure 4A:
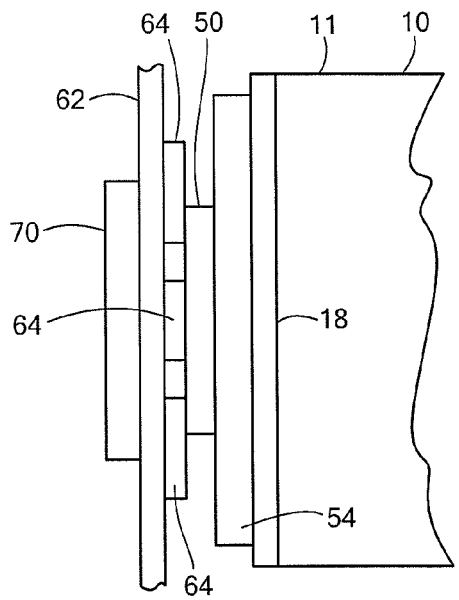
FIG. 4A is a plan view of a set screw.
Figure 4A:
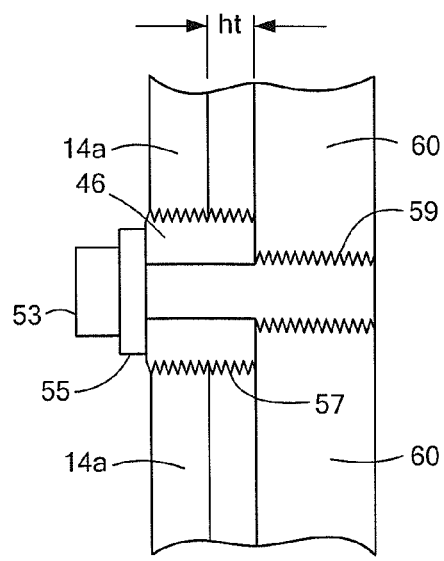
Figure 4A:
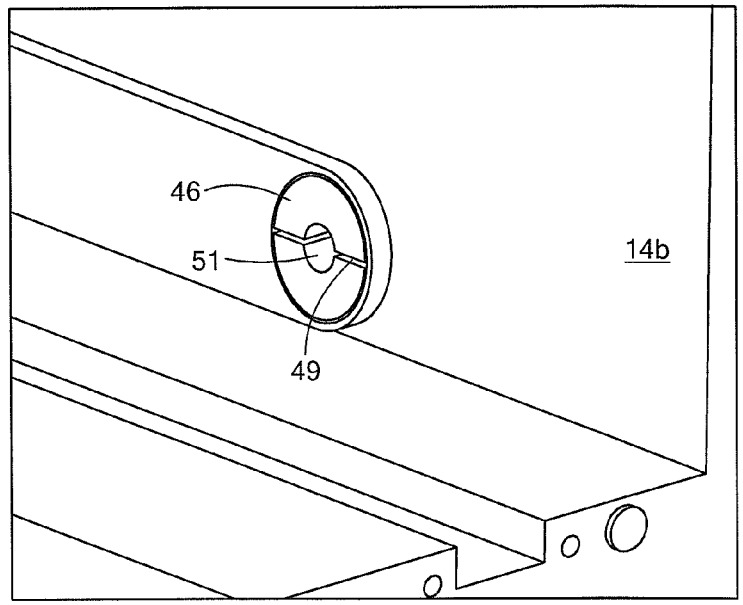

Referring to FIGS. 4A and 4B, the set screws 46 are used to attach the radar module 10 to the vertical stiffeners 60. A set screw 46 includes threads 57 that engage with threads in the supply manifold 14a. The set screw 46 includes a notch 49 configured to be engaged by a flat tip screwdriver to adjust its depth to reduce a horizontal tolerance $h_t$ between the supply manifold 14a and the vertical stiffener 60. The set screw 46 also includes a bore 51 to receive a bolt 53 with washer 55 to secure the radar module 10 to the vertical stiffener 60 by having the threads 57 of the bolt 53 engage threads 59 of the vertical stiffener. The set screws 46 are used to compensate for the different horizontal tolerances $h_t$ as each radar module 10 is being secured with the radar array framework 80. Though only set screws 46 on the supply manifold 14a are described in FIGS. 4A and 4B, one of ordinary skill in the art would recognize that set screws 46 function similarly on the return manifold 14b.

Referring to FIGS. 5A to 5E, the radiator panel 70 includes a housing 96 (e.g., an aluminum housing) with a stacked-path assembly 98 (sometimes called an element) in each cavity 100 of the housing; a radome 102; cyanate ester quartz (CEQ) 104; and an epoxy 106 to bond the stacked-patch 98 to the housing 96. Each stacked-patch assembly 98 includes an epoxy 108, a multi-layer RF circuit card 110, foam 112, which includes cross-linked polymers, and a thermal conductive layer 114 (e.g., aluminum, copper and so forth). In one example, the thermal conductive layer 114 is greater than 1 mil (e.g., about 60 mils). RF energy is supplied to the RF circuit card 110 via a connector (not shown) that protrudes thru the housing 90.

Figure 5A:
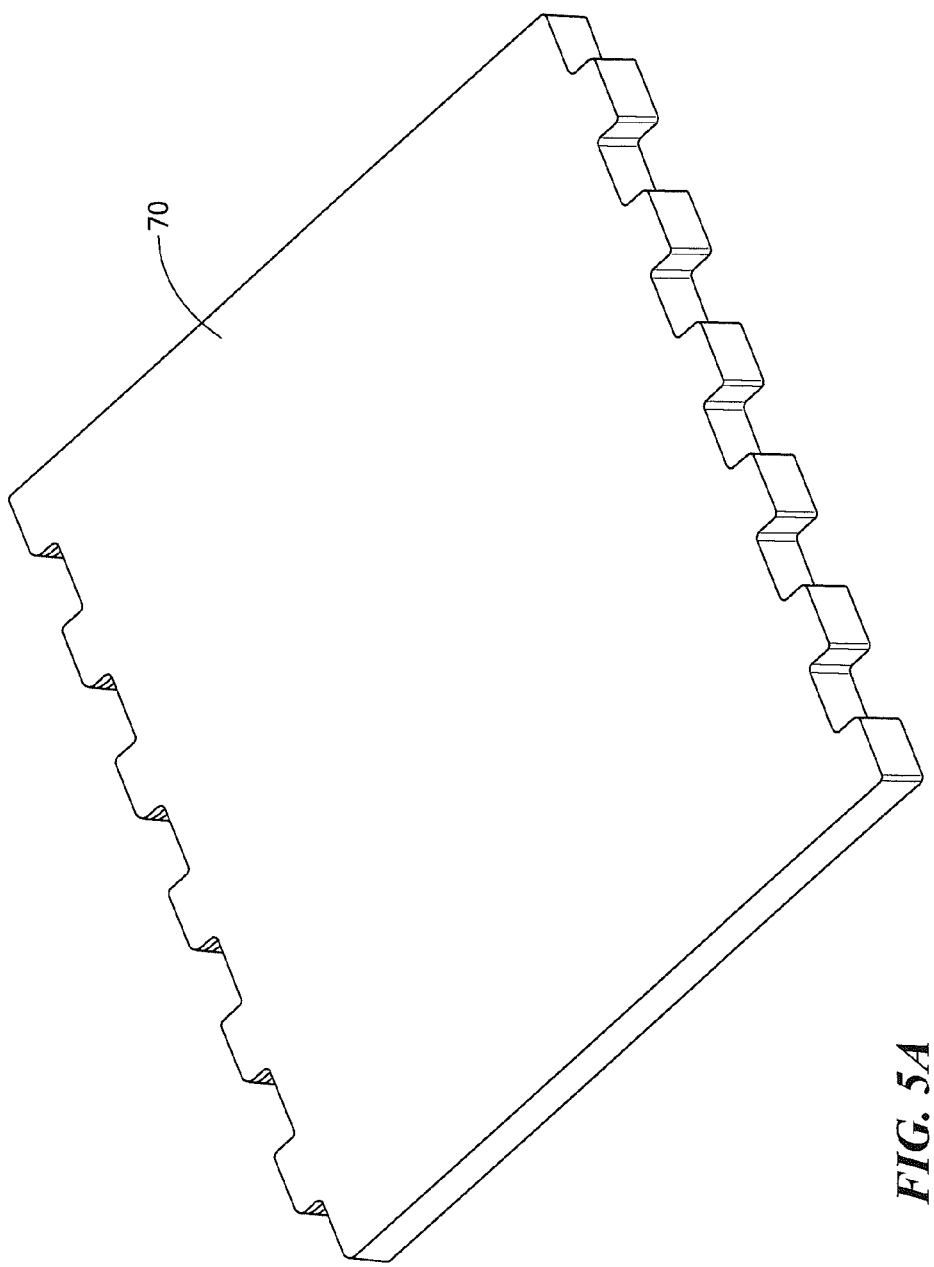
FIG. 5A is a plan view of a radiator panel.
Figure 5B:
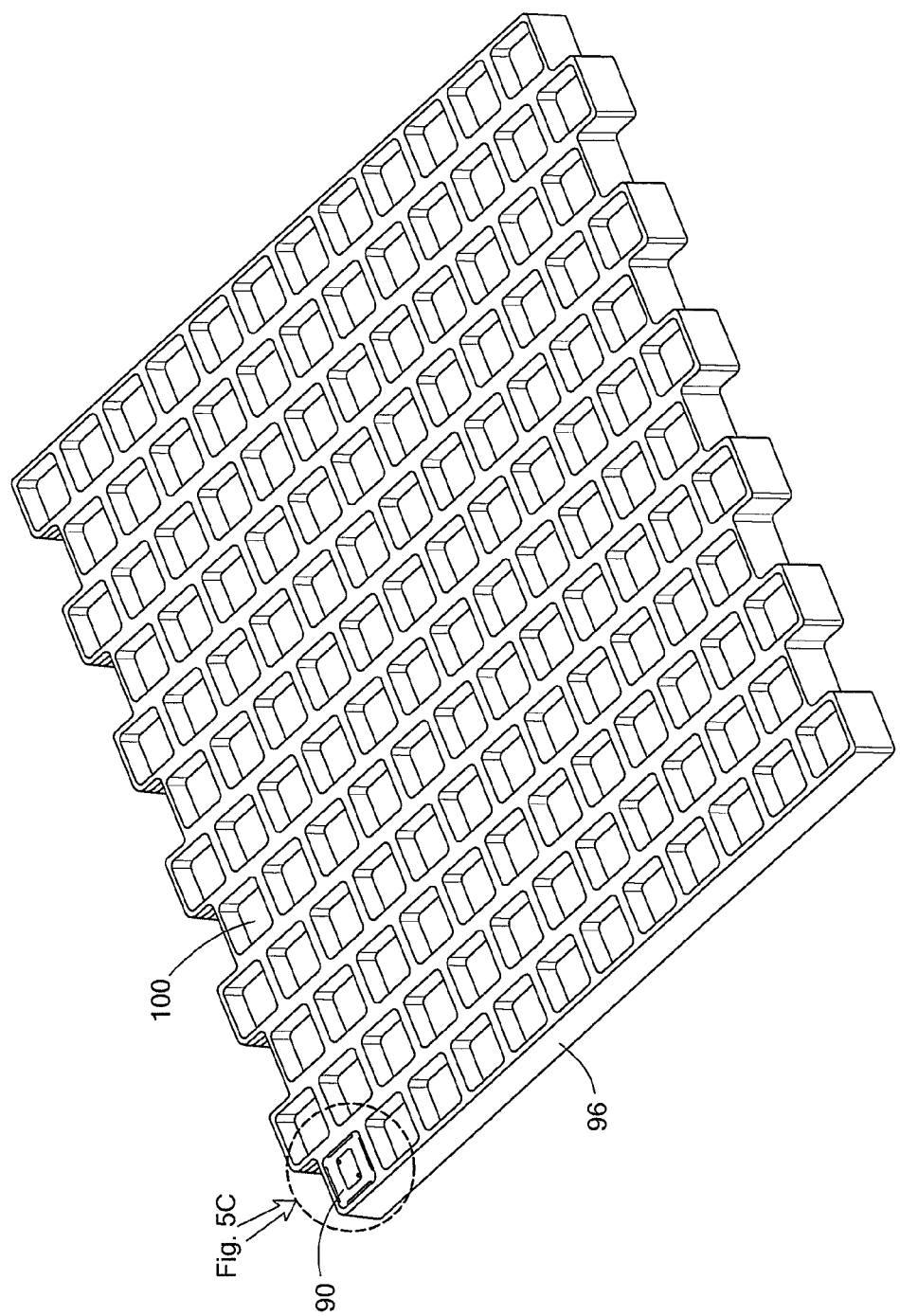
FIG. 5B is a plan view of a radiator housing with one stacked-patch assembly.
Figure 5C:
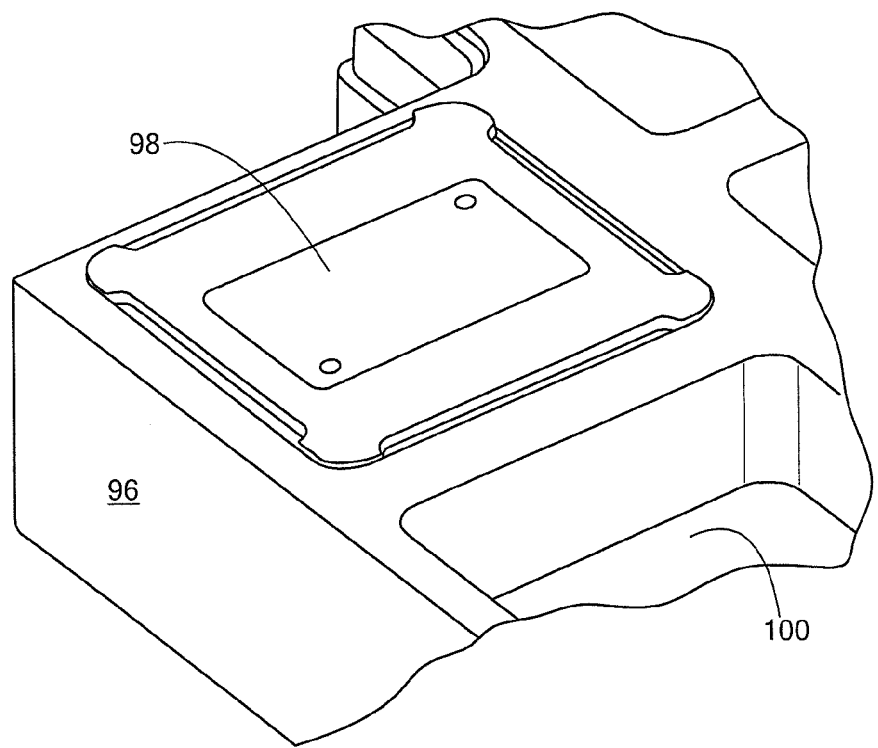
FIG. 5C is a plan view of the radiator housing taken at the line FIG. 5C in FIG. 5B.
Figure 5D:
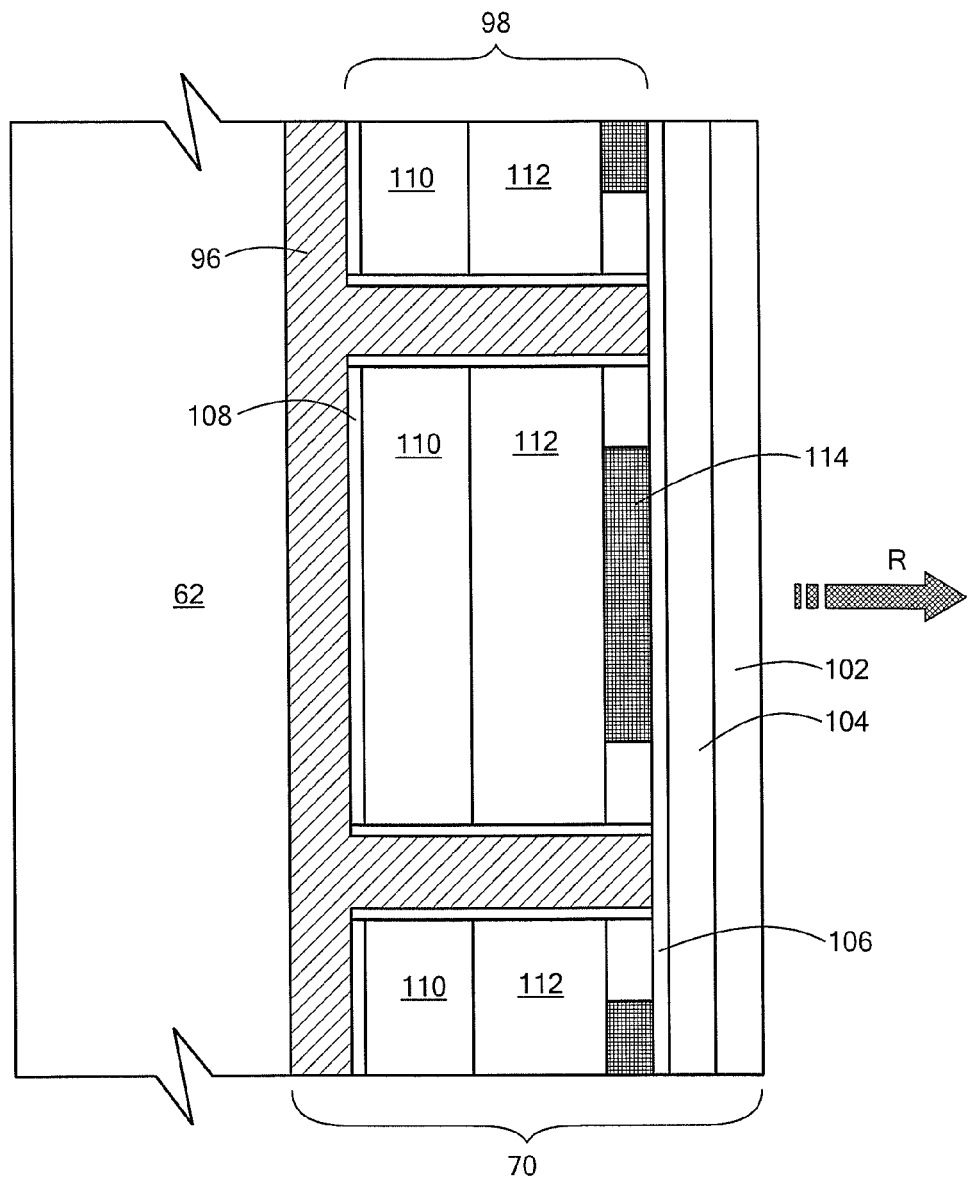
FIG. 5D is a cross-sectional view of an array plate and the radiator panel.
Figure 5E:
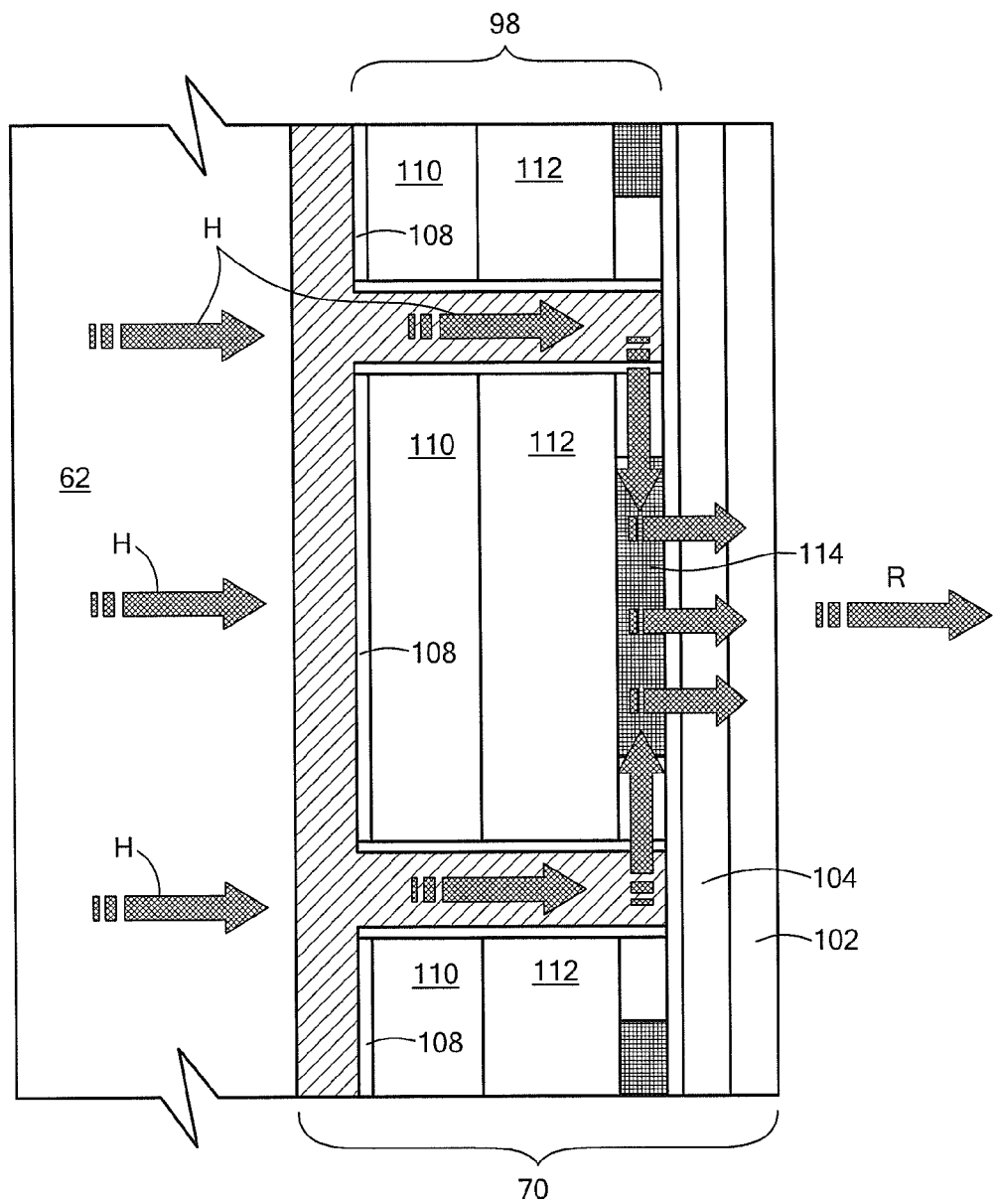
FIG. 5E a cross-sectional view of the array plate and the radiator panel depicting heat flow.

For simplicity, in FIGS. 5B and 5C, the radiator panel 70 does not include the radome 102, the CEQ 104 or the epoxy 106. Also, FIGS. 5B and 5C only depict a single stacked-patch assembly 98 in one cavity 100 while the remaining cavities are empty. In one example, the radiator panel 70 is about two feet by two feet and holds about one hundred forty-four stacked path assemblies 98.

The CEQ 104 adds structural integrity by protecting the radiator panel 70 from damage from objects colliding with the radiator panel 70. In one example, the objects may include hail.

The configuration of the stacked-patch assembly 98 contributes to adding an anti-icing feature to the radiator panel 70. Even though the coolant in the chassis 11 cools the T/R modules 33 there is some excess thermal energy that transfers to the array plate 62. The excess thermal energy (depicted by arrows H in FIG. 5E) flows from the array plate 62 through the housing 96 and through the thermal conductive layers 114 to the radome 102. The thermal conductive layers 114 with a high thermal conductivity directs the heat to the radome 102. The thermal energy transferred to the radome 102 is sufficient enough to maintain its surface at a temperature above freezing so that ice and snow does not accumulate on the radome 102.

Figure 6A:
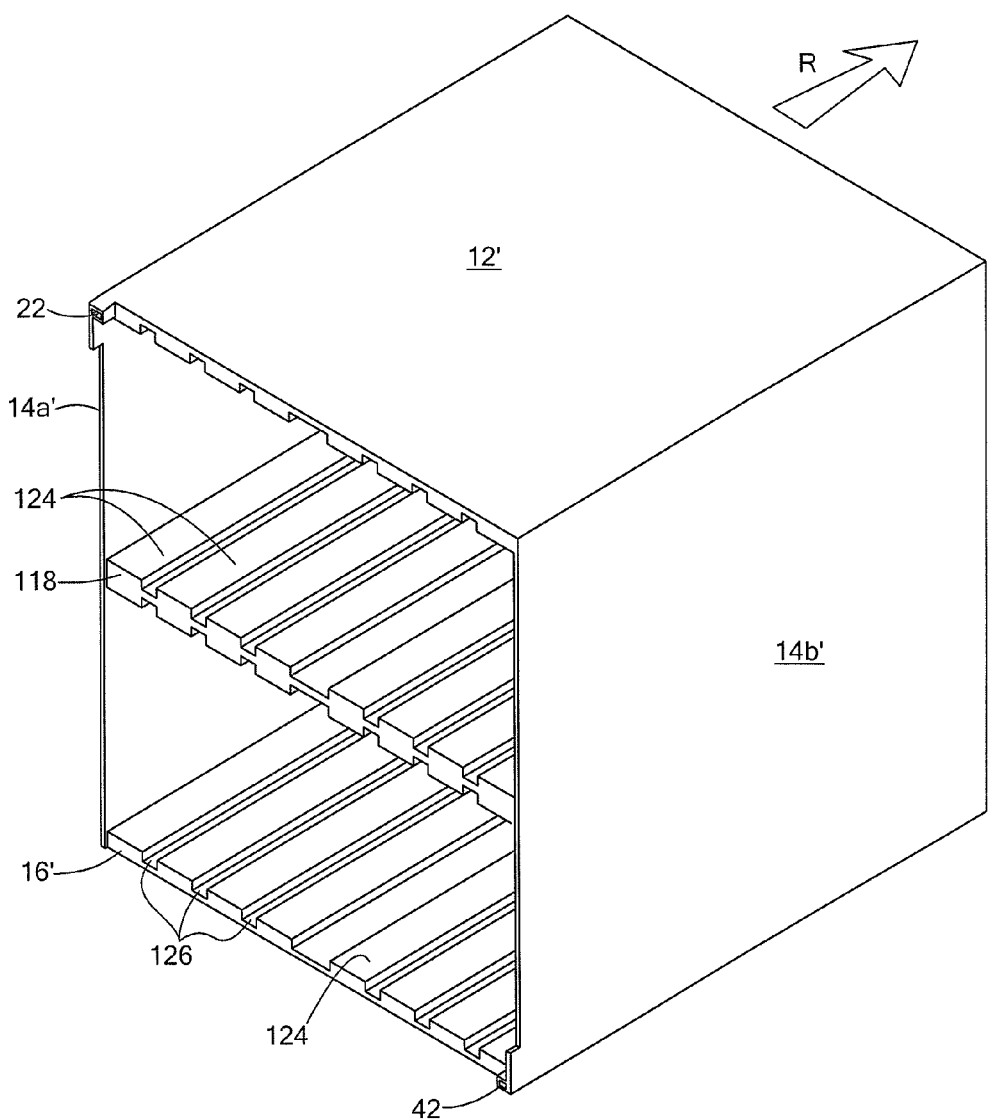
FIGS. 6A and 6B are plan views of a cooling chassis.
Figure 6B:
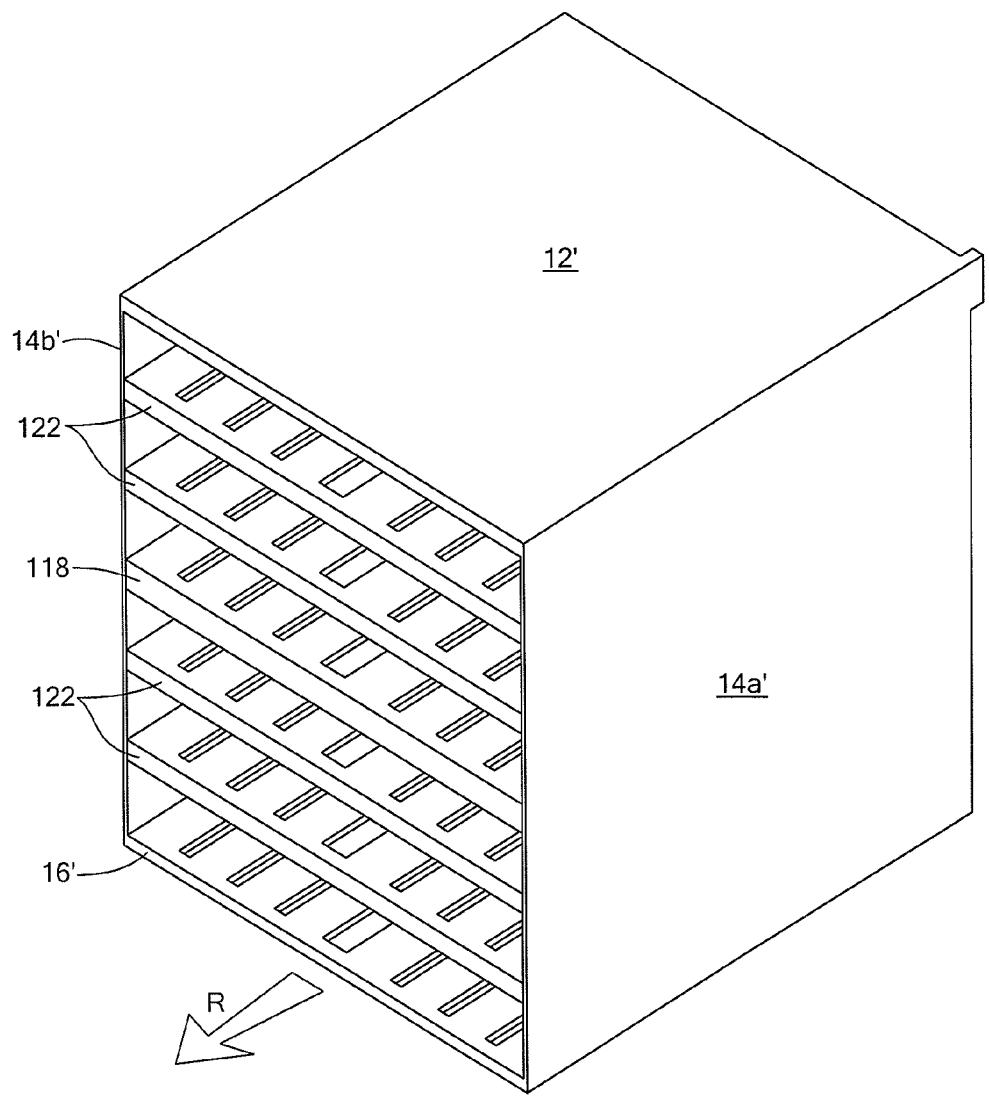

Referring to FIGS. 6A and 6B, the chassis 11 may be configured as chassis 11' that includes a supply manifold 14a' and a return manifold 14b' that are orientated on opposite sides than the supply manifold 14a and the return manifold 14b respectively in the chassis 11. Similarly, the chassis 11' includes a top cold plate 12' that is oriented opposite to the top cold plate 12 and a bottom cold plate 16' that is oriented opposite to the bottom cold plate 16. The chassis 11' also includes large cold plates 118 and small cold plates 122. These cold plates 118, 122 include cooling ribs 124 that include channels (not shown) to carry coolant. Gaps between the cooling ribs 124 form slots 126 that hold the TRIMMs 32 in a parallel configuration, which contributes to a more efficient cooling of the T/R modules 33. The slots 126 are also configured to hold the DDREX modules 34, the synthesizer module 36 and the auxiliary/controller module 40.

Figure 7:
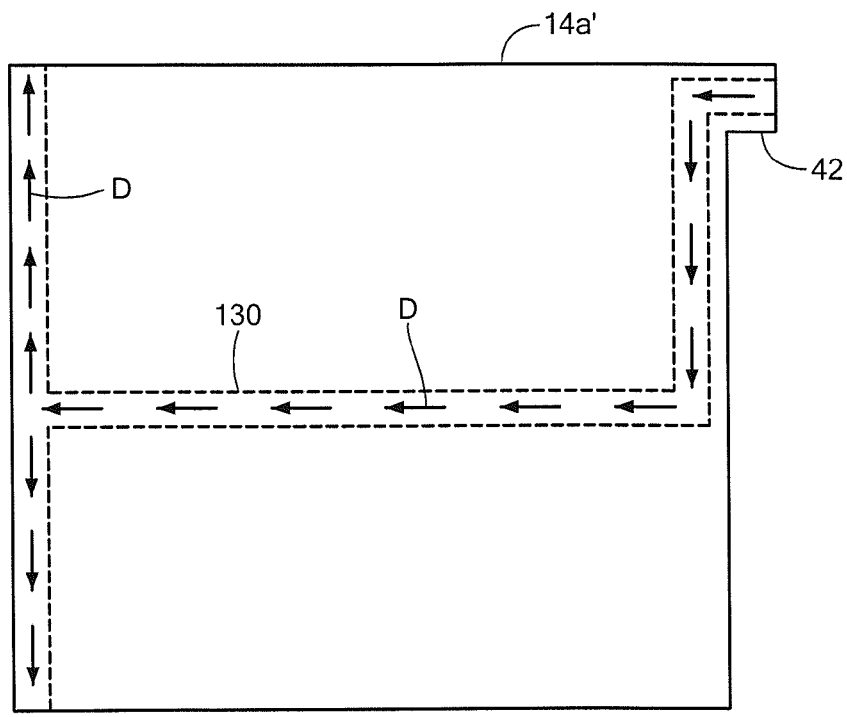
FIG. 7 is a view of a supply cold plate depicting an example of coolant flow.
Figure 8:
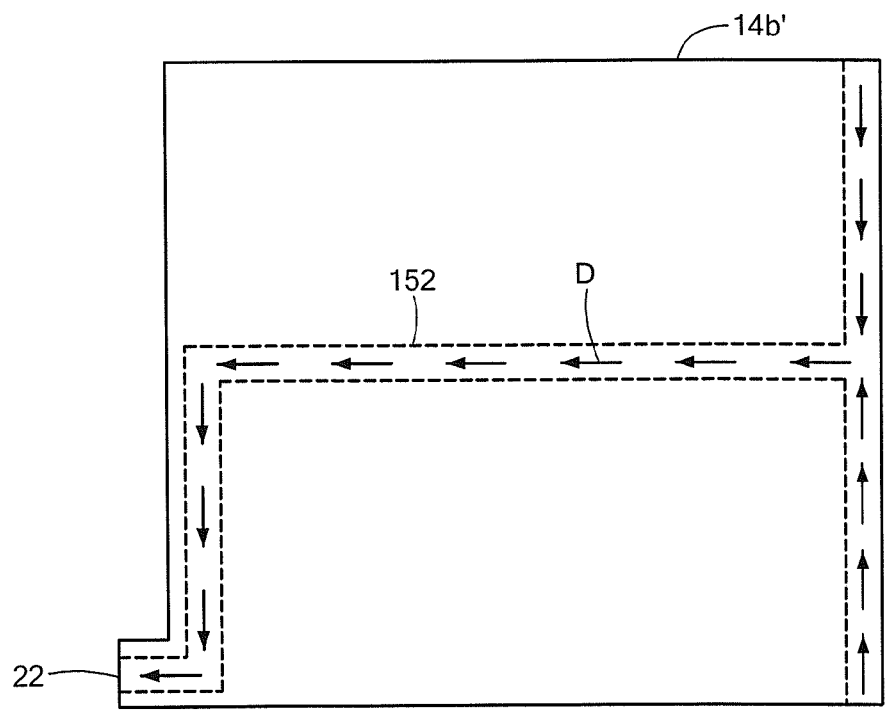
FIG. 8 is a view of a return cold plate depicting an example of coolant flow.
Figure 9A:
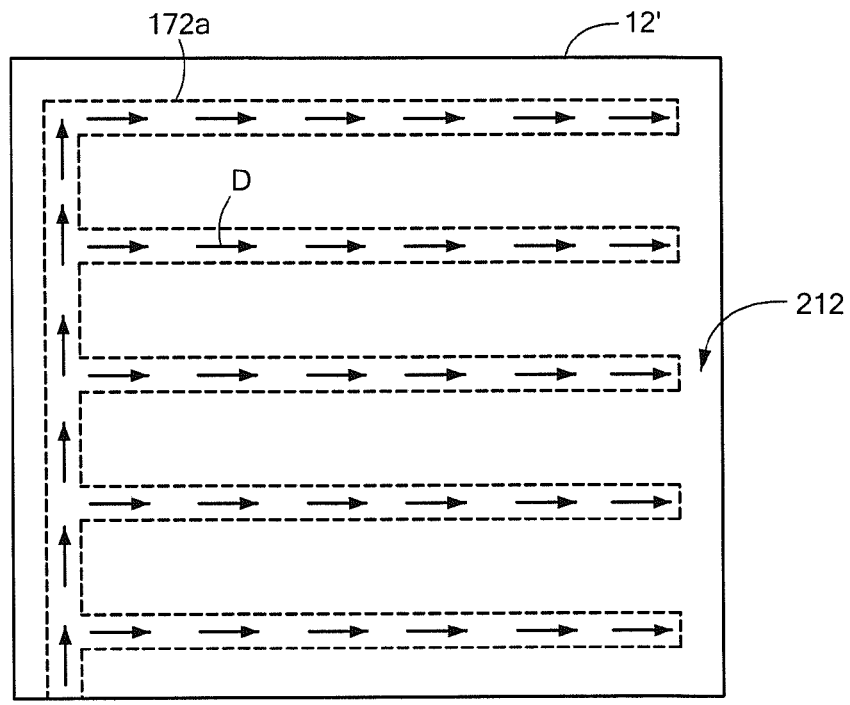
FIG. 9A is a top view of a top cold plate depicting an example of coolant flow.
Figure 9B:
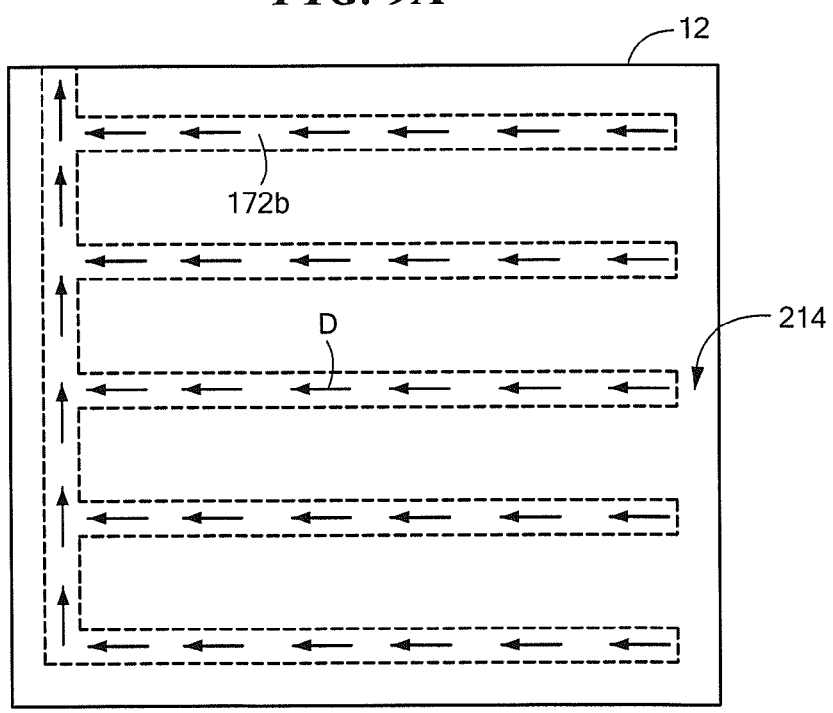
FIG. 9B is a bottom view of the top cold plate depicting an example of coolant flow.
Figure 9C:
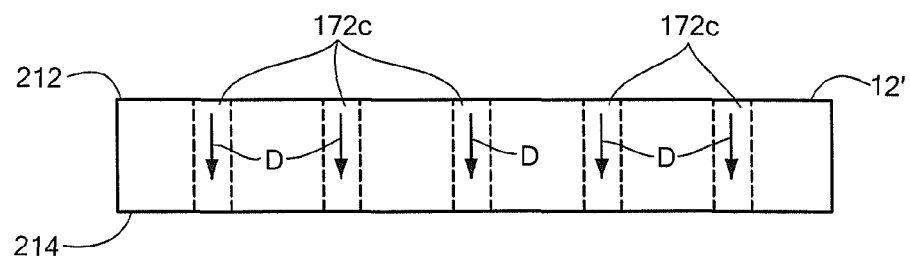
FIGS. 9C and 9D are side views of the top cold plate.
Figure 9D:
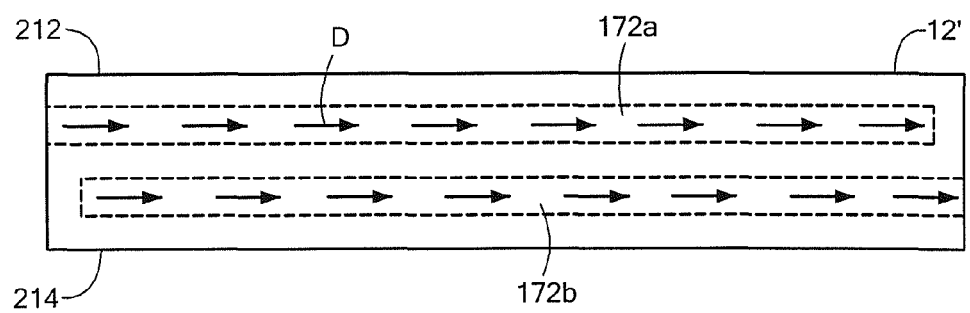

Referring to FIGS. 7 and 8, the supply cold plate 14a' receives coolant through the port 42 and flows through a channel 130 as indicated by arrows D. The return cold plate 14b' includes a channel 152 that carries coolant in a flow as indicated by arrows D to the port 22. In one example, the port 42 receives propylene glycol water (PGW) coolant at 10 gallons per minute (gpm) and 20° C. and the port 22 returns the PGW coolant at 30° C.

Referring to FIGS. 9A to 9D, the top cold plate 12' includes an upper channel 172a running along a top portion 212 of the top cold plate 12' and a lower channel 172b running along a bottom portion 214 of the top cold plate 12'. The upper channel 172a and the lower channel 172b are connected by channels 172c.

The processes described herein are not limited to the specific embodiments described. Elements of different embodiments described herein may be combined to form other embodiments not specifically set forth above. Other embodiments not specifically described herein are also within the scope of the following claims.

What is claimed is:

1. A radar array assembly comprising:
   two or more vertical stiffeners each having bores with threads; and
   a first radar module comprising:
   radar transmit and receive (T/R) modules; and
   a chassis having channels configured to receive a coolant, the chassis comprising:
   shelves having ribs, the ribs having channels configured to receive the coolant, the ribs forming slots to receive circuit cards disposed in parallel, the circuit cards comprising the T/R modules;
   set screws attached to opposing sides of the chassis, the set screws having bores to accept fasteners to engage the threads on a corresponding one of the two or more vertical stiffeners,
   wherein the first radar module is configured to operate as a stand-alone radar array.

2. The radar array assembly of claim 1 wherein the radar array module further comprises a dual digital receiver exciter (DDREX) module, a synthesizer module and an auxiliary power module disposed in the slots.

3. The radar array assembly of claim 1, further comprising:
   an array plate having a first side and a second side opposite the first side, the array plate being coupled to the vertical stiffeners;
   a radiator panel attached to the first side of the array plate; and
   RF jumpers attached to the second side of the array plate.

4. The radar array assembly of claim 3 wherein the first radar array module further comprises:
   a digital receiver and exciter (DREX) backplane coupled to the chassis;
   an RF backplane coupled to the DREX backplane; and
   an overlap beamformer having a first side and a second side opposite the first side, the first side of the overlap beamformer coupled to the RF backplane and the second side of the overlap beamformer coupled to the RF jumpers.

5. The radar array assembly of claim 3, wherein the radiator panel comprises stacked assemblies each comprising a thermal conductive layer.

6. The radar array assembly of claim 5, wherein the thermal conductive layer comprises at least one of aluminum and copper.

7. The radar array assembly of claim 5, wherein the thermal conductive layer is greater than 1 mil.

8. The radar array assembly of claim 7, wherein the thermal conductive layer is about 60 mils.

9. The radar array assembly of claim 1, further comprising a second radar module configured to be substantially the same as the first radar module.

10. The radar assembly of claim 1 wherein a set screw includes a notch configured to be engaged by a flat tip screwdriver.

11. A radar module comprising:
   radar transmit and receive (T/R) modules;
   a chassis having channels configured to receive a coolant, the chassis comprising:
   shelves having ribs, the ribs having channels configured to receive the coolant, the ribs forming slots to receive circuit cards disposed in parallel, the circuit cards comprising the T/R modules; and a dual digital receiver exciter (DDREX) module, a synthesizer module, and an auxiliary power module disposed in the slots;
   wherein the radar module is configured to:
   perform as a standalone radar array; and
   perform with other radar modules to form a radar array.

12. The radar array module of claim 11, further comprising:
   a digital receiver and exciter (DREX) backplane coupled to the chassis;
   an RF backplane coupled to the DREX backplane; and
   an overlap beamformer having a first side and a second side opposite the first side, the first side of the overlap beamformer coupled to the RF backplane and the second side of the overlap beamformer coupled to RF jumpers.

13. A radar module comprising:
   radar transmit and receive (T/R) modules; and
   a chassis having channels configured to receive a coolant, the chassis comprising:
   shelves having ribs, the ribs having channels configured to receive the coolant, the ribs forming slots to receive circuit cards disposed in parallel, the circuit cards comprising the T/R modules;
   wherein the radar module is configured to:
   perform as a standalone radar array; and
   perform with other radar modules to form a radar array,
   wherein the chassis further comprises set screws attached to opposing sides of the chassis, the set screws having bores to accept fasteners to engage the threads on a corresponding one of two or more vertical stiffeners.

14. The radar module of claim 13 wherein a set screw includes a notch configured to engage a flat tip screwdriver.

* * * * *